(12) United States Patent
Hsu et al.

(10) Patent No.: US 6,673,664 B2
(45) Date of Patent: Jan. 6, 2004

(54) METHOD OF MAKING A SELF-ALIGNED FERROELECTRIC MEMORY TRANSISTOR

(75) Inventors: Sheng Teng Hsu, Camas, WA (US); Tingkai Li, Vancouver, WA (US); Fengyan Zhang, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 291 days.

(21) Appl. No.: 09/978,487

(22) Filed: Oct. 16, 2001

(65) Prior Publication Data

US 2003/0071292 A1 Apr. 17, 2003

(51) Int. Cl.[7] .......................................... H01L 21/8238
(52) U.S. Cl. ........................... 438/229; 438/230; 438/3; 438/239; 438/253; 438/396
(58) Field of Search ............................. 257/295; 438/3, 438/238, 239, 240, 253, 254, 255, 256, 380, 381, 396, 397, 398, 399, 229, 230

(56) References Cited

U.S. PATENT DOCUMENTS

| | | | | |
|---|---|---|---|---|
| 5,147,811 A | * | 9/1992 | Sakagami | 438/257 |
| 5,739,563 A | * | 4/1998 | Kawakubo et al. | 257/295 |
| 5,907,762 A | * | 5/1999 | Evans et al. | 438/240 |
| 5,962,884 A | * | 10/1999 | Hsu et al. | 257/295 |
| 6,072,221 A | * | 6/2000 | Hieda | 257/382 |
| 6,083,791 A | * | 7/2000 | Bergemont | 438/258 |
| 6,114,724 A | * | 9/2000 | Ratnakumar | 257/326 |
| 6,136,643 A | * | 10/2000 | Jeng et al. | 438/253 |
| 6,200,856 B1 | * | 3/2001 | Chen | 438/257 |
| 6,251,763 B1 | * | 6/2001 | Inumiya et al. | 438/595 |
| 6,281,535 B1 | * | 8/2001 | Ma et al. | 257/295 |
| 6,329,248 B1 | * | 12/2001 | Yang | 438/267 |
| 6,515,338 B1 | * | 2/2003 | Inumiya et al. | 257/368 |
| 6,534,374 B2 | * | 3/2003 | Johnson et al. | 438/381 |
| 6,607,952 B1 | * | 8/2003 | Yagishita et al. | 438/216 |

* cited by examiner

Primary Examiner—Amir Zarabian
Assistant Examiner—Ida M. Soward
(74) Attorney, Agent, or Firm—David C. Ripma; Matthew D. Rabdau; Scott C. Krieger

(57) ABSTRACT

A method of making a self-aligned ferroelectric memory transistor includes preparing a substrate, shallow trench isolation, n the polysilicon; and forming a gate stack, including: depositing a layer of silicon nitride; selectively etching the silicon nitride, the bottom electrode and the polysilicon; selectively etching the polysilicon to the level of the first dielectric layer; and implanting and activating ions to form a source region and a drain region; forming a sidewall barrier layer; depositing a layer of ferroelectric material; forming a top electrode structure on the ferroelectric material; and finishing the structure, including passivation, oxide depositing and metallization.

24 Claims, 4 Drawing Sheets

METHOD OF MAKING A SELF-ALIGNED FERROELECTRIC MEMORY TRANSISTOR

RELATED APPLICATIONS

This application is related to One Transistor Ferroelectric Memory Cell and Method of Making Same, Ser. No. 08/812,759, filed Mar. 9, 1997; Shallow Junction Ferroelectric Memory Cell and Method of Making Same, Ser. No. 08/869,534, filed Jun. 6, 1997; Ferroelectric Memory Cell for VLSI RAM Array and Method of Making Same, Ser. No. 08/870,375, filed Jun. 6, 1997; Method of Manufacture of Single-Transistor Ferroelectric Memory Cell Using Chemical-Mechanical Polishing, U.S. Pat. No. 5,907,762, granted May 25, 1999; Single Transistor Ferroelectric Memory Cell with Asymmetric Ferroelectric Polarization and Method of Making the Same, Ser. No. 08/905,380, filed Aug. 8, 1997; Ferroelectric Nonvolatile Transistor, U.S. Pat. No. 6,048,740, granted Apr. 11, 2000; Method of Fabricating Ferroelectric Transistors, Ser. No. 09/783,817, filed Feb. 13, 2001; and Method of making a ferroelectric memory transistor, Ser. No. 09/929,710, filed Aug. 13, 2001.

FIELD OF THE INVENTION

This invention relates to the fabrication of high density integrated non-volatile memory devices, and specifically to the fabrication of a self-aligned ferroelectric memory transistor

BACKGROUND OF THE INVENTION

MFMOS ferroelectric devices have desirable characteristics as memory transistors, however, one of the most difficulties processes in MFMOS ferroelectric memory transistor fabrication is the step of etching the bottom electrode. The bottom electrode has to be selectively etched without etching through the thin oxide layer, typically located under the bottom electrode, and into the silicon substrate. The oxide layer underlying the bottom electrode may be either silicon dioxide, or a suitable high-k insulator. If the underlying substrate is inadvertently etched, it is impossible to form a good source/drain junction having adequate connections to the conductive channel of the transistor.

SUMMARY OF THE INVENTION

A method of making a self-aligned ferroelectric memory transistor includes preparing a substrate, including forming a p-well, depositing a first dielectric layer over the p-well, and forming a layer of n+ polysilicon over the first dielectric layer; forming shallow trenches for use in a shallow trench isolation process, wherein the shallow trenches extend through the polysilicon, the first dielectric layer, and about 500 nm of the substrate; depositing silicon oxide in the shallow trenches; removing the polysilicon except in active areas; depositing a bottom electrode on the polysilicon; forming a gate stack, including: depositing a layer of silicon nitride; selectively etching the silicon nitride, the bottom electrode and the polysilicon; selectively etching the polysilicon to the level of the first dielectric layer; and implanting and activating ions to form a source region and a drain region; depositing a layer of silicon oxide, wherein the silicon oxide layer is between about 1.5 to 2.0 times the thickness of the gate stack; planarizing the silicon oxide layer to the level of the silicon nitride; removing the silicon nitride; forming a sidewall barrier layer by depositing a layer of barrier metal in a thickness of between about 5 nm to 30 nm; depositing a layer of ferroelectric material forming a top electrode structure on the ferroelectric material; and finishing the structure, including passivation, oxide depositing and metallization.

It is an object of the invention to provide a method fabricating a self-aligned MFMOS ferroelectric memory transistor.

Another object of the invention is to construct a ferroelectric stack and associated electrodes without contaminating the underlying structures.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENT

The method of the invention teaches the fabrication of a self-aligned MFMOS gate stack. The method of the invention is useful for fabricating very small geometry, very high-density memory devices. In the method of the invention, there is no need for highly selective etching, and the electrode etching process may be accomplished by conventional state-of-the-art techniques.

Figure 1:
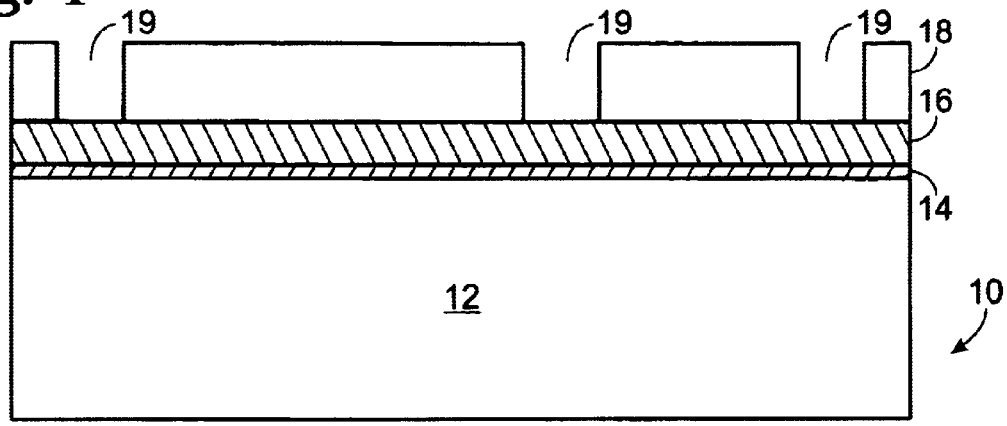
FIGS. 1–9 depict successive steps in fabricating a MFMOS ferroelectric memory device according to the method of the invention.

The fabrication process is as follows, and now referring to FIG. 1, a p-type silicon wafer is selected as the substrate 10. Boron is implanted into the p-well regions of the wafer, and diffused to form a p-well 12. A first dielectric layer, which, in the preferred embodiment, takes the form of a thin layer of gate oxide 14, is grown. A high-k dielectric may be substituted for the gate oxide. A layer 16 of n+ doped polysilicon is deposited. The doped polysilicon may be replaced with a layer of undoped polysilicon, followed by implantation of a heavy does of phosphorus or arsenic to convert the undoped polysilicon to n+ doped polysilicon. In either case, this n+ doped layer of polysilicon is referred to herein as polysilicon I, and is deposited to a thickness of between about 50 nm to 300 nm. If phosphorus ion are implanted, the implanting energy is between about 30 keV to 60 keV. If arsenic ion are implanted, the implanting energy is 50 keV to 90 keV. The ion does is $2 \times 10^{15}$ cm$^{-2}$ to $5 \times 10^{15}$ cm$^{-2}$.

Figure 2:
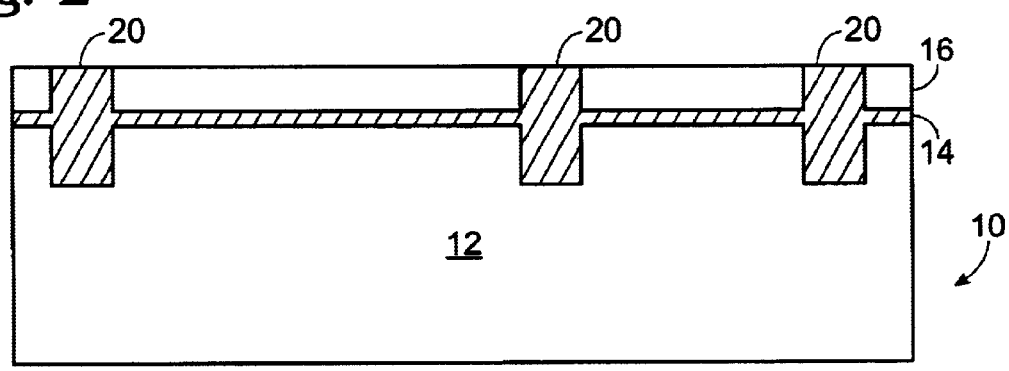

Photoresist 18 is used to define the shallow trench isolation areas 19. Shallow trenches are etched through the polysilicon, the gate insulator and through about 500 nm of silicon. The photoresist is removed. Any damage caused by plasma etching is removed, the wafer is cleaned, and a layer of oxide 20 is deposited onto the wafer, as depicted in FIG. 2. The thickness of the oxide is 1.5 times to 2 times thicker than the depth of the shallow trenches. Chemical mechanical polishing (CMP) is used to planarize the wafer. The CMP stops at the top of polysilicon I layer. After CMP, all of the polysilicon I layer is removed, except that on the active areas.

Figure 3:
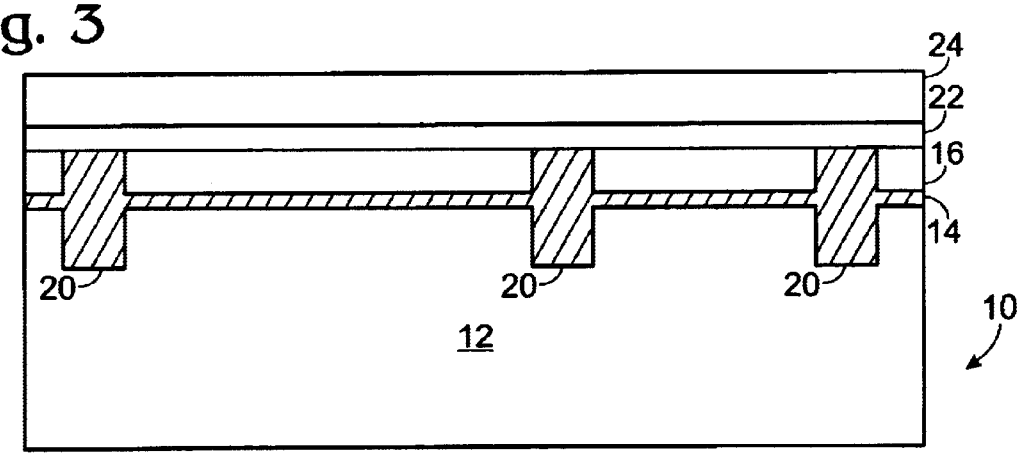

Next, a bottom electrode 22 is deposited, by either physical vapor deposition (PVD), or chemical vapor deposition (CVD). The bottom electrode material is selected from the group of materials including Ir, Pt, TiN, Ta, TaN, TiTaN, and Ir—Pt alloy. The bottom electrode has to be sufficiently thick so that it will not be completely converted to silicide. It is also beneficial to have a multi-layer bottom electrode, with a layer of TiN, TaN or TiTaN covered by a layer of Ir or Pt. The metal nitride layer prevents the silicidation of the top layer of Ir or Pt. After bottom electrode deposition, a thick layer of silicon nitride 24 is deposited. The thickness of this layer is from 200 nm to 400 nm, as depicted in FIG. 3.

Figure 4:
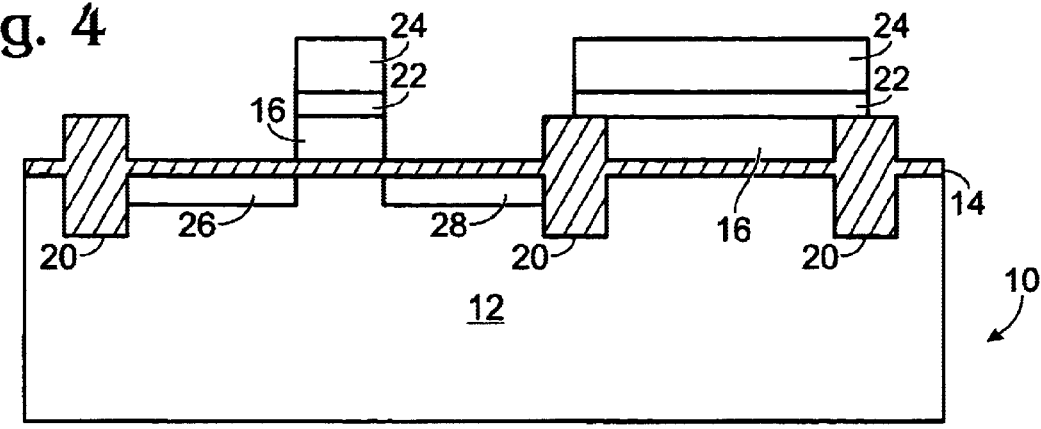

Photoresist is applied to mask the structure prior to selective etching of the nitride, bottom electrode and the n+ polysilicon I layer. It will be understood by those of ordinary skill in the art that selective etching of the bottom electrode to form a bottom electrode area, having an outer margin thereabout, without etching the polysilicon I layer is not possible, as the polysilicon I layer will be etched by any known process which is suitable for etching the bottom electrode. Following the etching process, polysilicon I layer is selectively etched to the level of the gate oxide. This forms a sacrificial gate. The sacrificial gate extends into the shallow trench isolation (STI) area by one alignment tolerance. There will be no other interconnects to the sacrificial gate electrode. A source 26 and a drain 28 of the device are formed by implantation of arsenic or phosphorus ions. The ion energies are between about 20 keV to 90 keV for arsenic and between about 10 keV to 50 keV for phosphorus. The ion does is from $1 \times 10^{15}$ cm$^{-2}$ to $5 \times 10^{15}$ cm$^{-2}$. This is illustrated in FIG. 4.

Figure 5:
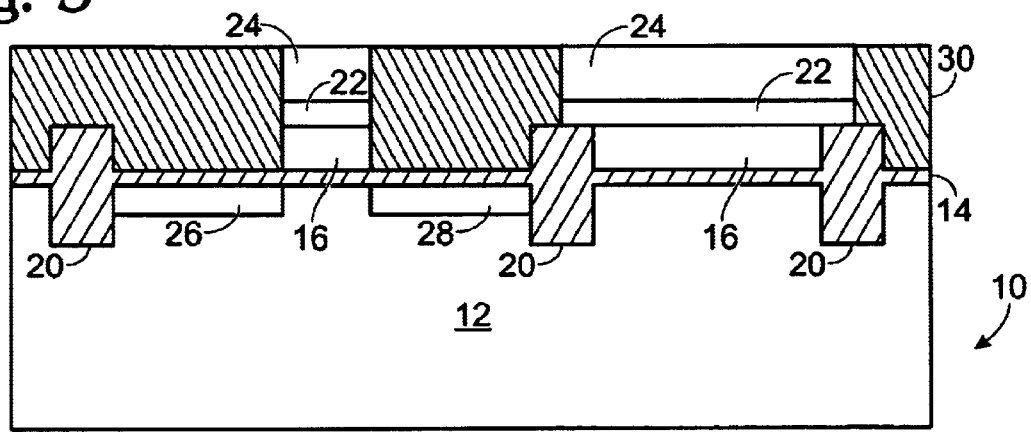

Referring now to FIG. 5, a layer of oxide 30 with a thickness 1.5 times to 2 times that of the sacrificial gate stack is deposited onto the wafer and is CMP planarized.

Figure 6:
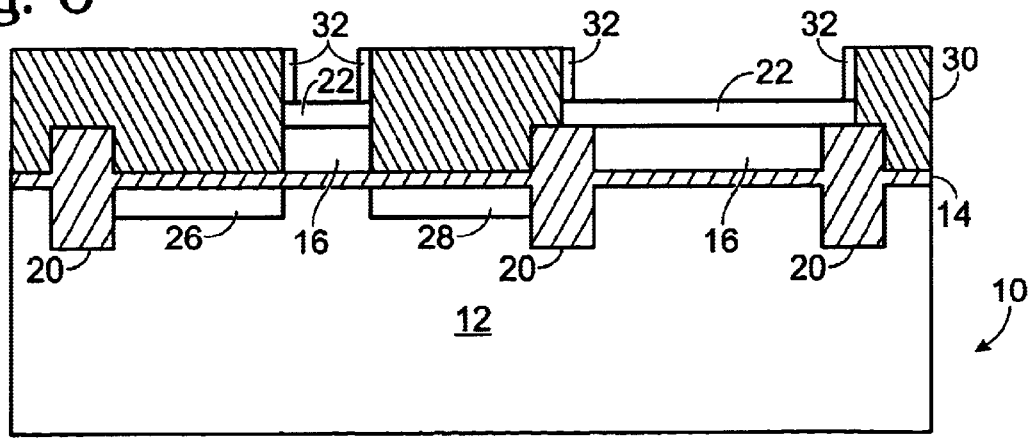

Turning now to FIG. 6, the nitride layer is removed by a wet etch process. After removing the nitride layer, a trench is formed on the sacrificial gate stack location, and a thin layer of barrier material such as TiO$_2$ or Al$_3$O$_5$, or Si$_3$N$_4$ is deposited. The thickness of this layer is between about 5 nm to 30 nm. The barrier layer is etched in a plasma chamber to form a sidewall barrier layer 32 in the trench formed by the removal of the sacrificial gate stack, as shown in FIG. 6.

Figure 7:
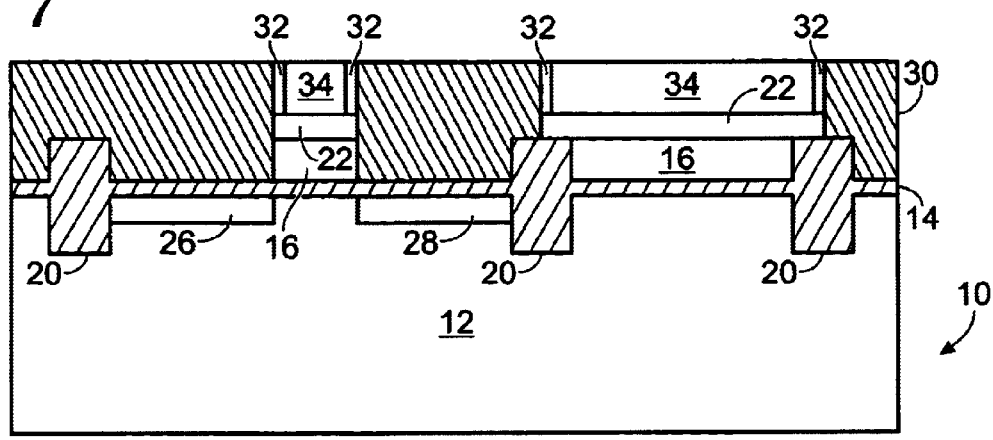

Referring to FIG. 7, ferroelectric film 34 is deposited by either of a MOCVD or spin coating process. The ferroelectric film is selected from the group of ferroelectric materials including lead germanium oxide (Pb$_5$Ge$_3$O$_{11}$) (PGO), Pb (Zr,Ti) O$_3$(PZT), or Sr Bi$_2$Ta$_2$O$_9$ (SBT). A CMP process is used to planarize the wafer, which removes any ferroelectric material outside of the sacrificial gate trench region.

Figure 8:
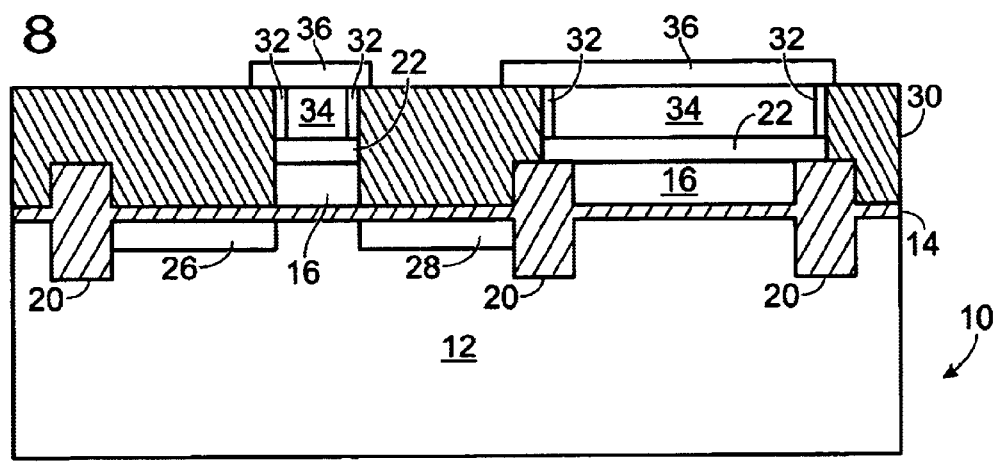

Top electrode metal 36 is selected from the group of material including Pt, Ir; and Pt/Ir, and is deposited by any state-of-the-art method, such as PDV or CVD. Photoresist is used to form a mask prior to selective plasma etching of the top electrode. The top electrode is the control gate of the memory device. The top electrode extends beyond the margins of the active device area, as shown in FIG. 8.

Figure 9:
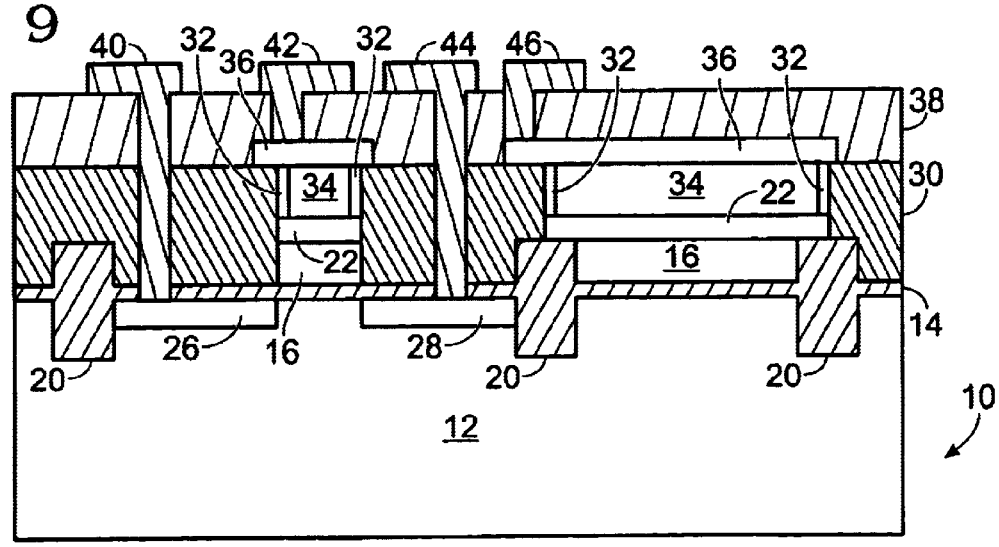

The remaining processes of passivation, oxide 38 deposition, contact hole etching, and metallization 40,42,44 and 46, may be performed using any state-of-the-art process. The final structure is shown in FIG. 9.

Figure 10:
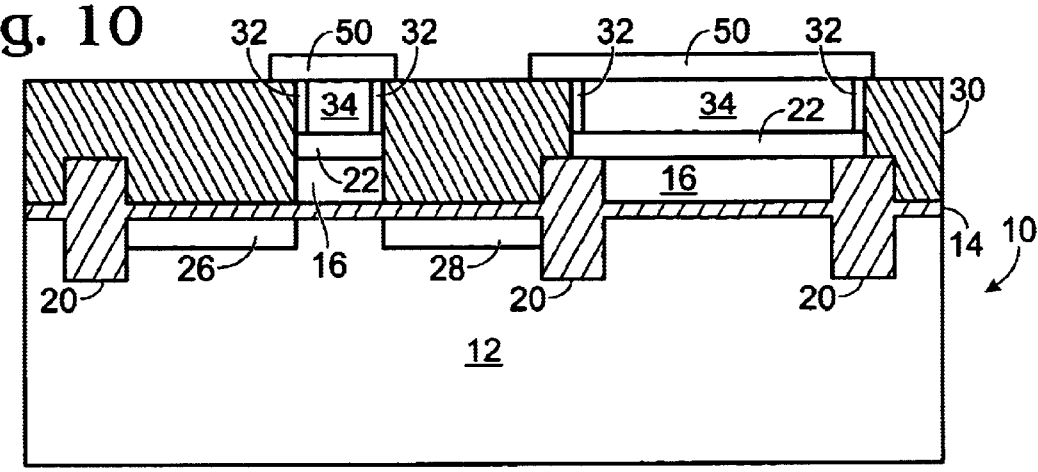
FIGS. 10–12 depict alternative steps in fabricating a MFMOS ferroelectric memory device according to the method of the invention.
Figure 11:
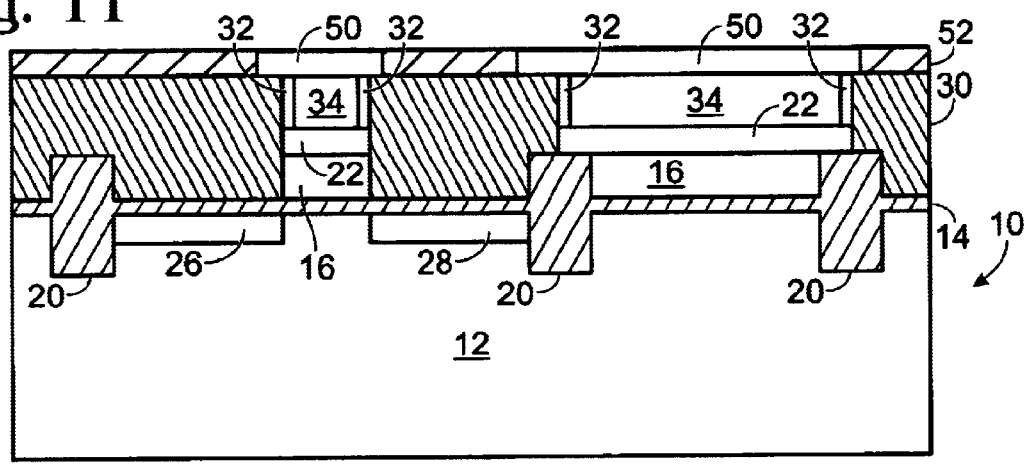
Figure 12:
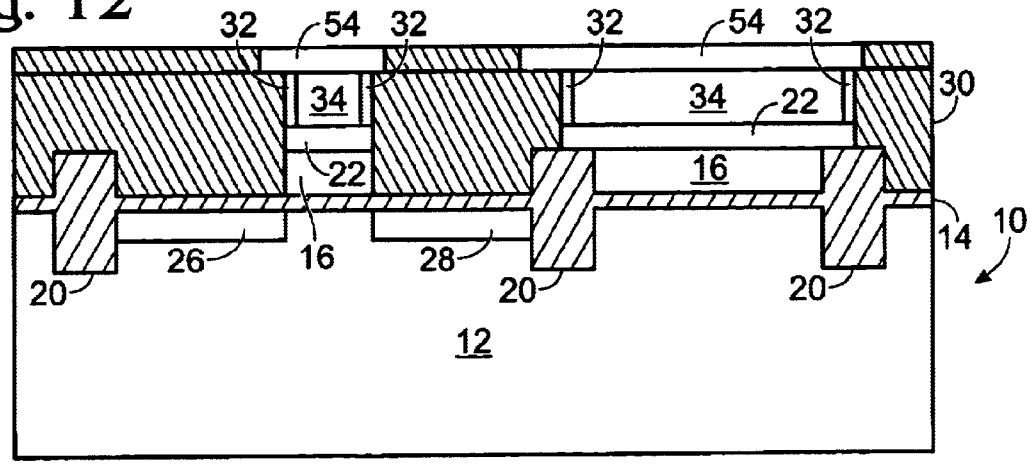

The metal for the top electrode is relatively difficult to etch, and during top electrode etching, substantial damage may occur to the ferroelectric material beneath the top electrode. This can be resolved by using a replacement gate technique. Using the structure of FIG. 7 as a starting point, and now referring to FIG. 10, a layer of silicon nitride 50, having a thickness of between about 100 nm to 300 nm, is deposited and is etched as a sacrificial gate. A layer of oxide 52 having thickness equal to 1.5 times to 2 times that of the SiN layer is deposited and is planarized using a CMP process, as shown in FIG. 11. The SiN sacrificial gate is removed using a wet etch process. The top electrode 54 is deposited and is CMP polished, stopping at the oxide level, as shown in FIG. 12. This defines the top electrode without plasma etching the refractory metal. Plasma etching of SiN is a state-of-the-art process and is known not to cause significant etch damage to the ferroelectric stack.

The advantages of the method of the invention is that the ferroelectric thin film is formed only on the active memory gate area. The MFMOS gate stack is self-aligned, and high-density integration is possible. The MFM stack is not formed by an etching process, therefore, the etching related device property degradation, and any stray capacitances, are minimized, making lower voltage programming possible. The ferroelectric thin film is completely surrounded by protective dielectric and the top and bottom electrodes. Forming gas annealing related degradation is also minimized. In addition, the bottom electrode may be etched using any sputter or ion milling process, which does not have good selectivity to either oxide or polysilicon. The critical etching step is selective etching of n+ polysilicon, which is a standard process in CMOS fabrication. There is no special critical process for this FeRAM fabrication.

Thus, a method of making a self-aligned ferroelectric memory transistor has been disclosed. It will be appreciated that further variations and modifications thereof may be made within the scope of the invention as defined in the appended claims.

We claim:

1. A method of making a self-aligned ferroelectric memory transistor, comprising:
   preparing a substrate, including forming a p-well, depositing a first dielectric layer over the p-well, and forming a layer of n+ polysilicon over the first dielectric layer;
   forming shallow trenches for use in a shallow trench isolation process, wherein the shallow trenches extend through the polysilicon, the first dielectric layer, and about 500 nm of the substrate;
   depositing silicon oxide in the shallow trenches;
   removing the polysilicon except in active areas;
   depositing a bottom electrode on the polysilicon;
   forming a self-aligned gate stack including:
      depositing a layer of silicon nitride;
      patterning and selectively etching the silicon nitride, the bottom electrode and the polysilicon, wherein the patterned and etched bottom electrode has an outer margin;
      selectively etching the polysilicon to the level of the first dielectric layer; and
      implanting and activating ions to form a source region and a drain region, wherein each of the source region and drain region has an edge underlying the outer margin of the bottom electrode and wherein neither of the source region nor the drain region underlies the bottom electrode outer margin;
   depositing a layer of silicon oxide, wherein the silicon oxide layer is between about 1.5 times to 2.0 times the thickness of the gate stack;
   planarizing the silicon oxide layer to the level of the silicon nitride;
   removing to silicon nitride;
   forming a sidewall barrier layer by depositing a layer of barrier metal in a thickness of between about 5 nm to 30 nm;

depositing a layer of ferroelectric material on the bottom electrode in an area bounded by the bottom electrode outer margin;

forming a top electrode structure on the ferroelectric material in an area bounded by to bottom electrode outer margin; and finishing the structure, including passivation, oxide depositing and metallization.

2. The method of claim 1 wherein said polysilicon layer is formed to a thickness of between about 50 nm to 300 nm.

3. The method of claim 1 wherein said depositing a bottom electiode includes depositing an electrode material taken from the group of materials consisting of Ir, Pt, TiN, Ta, TaN, TiTaN and Ir—Pt alloy.

4. The method of claim 1 wherein said depositing a bottom electrode includes depositing an electrode material taken from the group of materials consisting of TiN, TaN, and TiTaN, and which further includes depositing a layer of material taken from the group of materials consisting of Ir and Pt over the bottom electrode.

5. The method of claim 1 wherein said depositing a layer of silicon nitride in the gate stack includes depositing a layer of material to a thickness of between about 200 nm to 400 nm.

6. The method of claim 1 wherein said forming a sidewall barrier layer includes depositing a material taken from the group of materials consisting of $TiO_2$, $Al_3O_5$, and $Si_1N_4$.

7. The method of claim 1 wherein said depositing a layer of ferroelectric material includes depositing a material taken from the group of materials consisting of PGO, PZT or SBT.

8. The method of claim 1 wherein said depositing a top electrode includes depositing an electrode material taken from the group of materials consisting of Ir, Pt, and Ir—Pt alloy.

9. The method of claim 1 wherein said depositing a top electrode includes depositing electrode material to extend beyond the margins of the active device area.

10. The method of claim 1 wherein said forming a top electrode structure on the ferroelectric material includes depositing top electrode metal on the ferroelectric stack.

11. The method of claim 1 wherein said forming a top electrode structure on the ferroelectric material includes depositing a layer of silicon nitride to a thickness of between about 100 nm to 300 nm on the ferroelectric stack; etching the silicon nitride layer to form a control gate placeholder; depositing a layer of oxide over the structure and planarizing the oxide to the top of the silicon nitride layer; removing the silicon nitride; and depositing top electrode metal on the ferroelectric stack.

12. A method of making a self-aligned ferroelectric memory transistor, comprising:

preparing a substrate, including forming a p-well, depositing a first dielectric layer over the p-well, and forming a layer of n+ polysilicon over the first dielectric layer;

forming shallow wenches for use in a shallow trench isolation process, wherein the shallow trenches extend through the polysilicon, the first dielectric layer, and about 500 nm of the substrate;

depositing silicon oxide in the shallow trenches;

removing the polysilicon except in active areas;

depositing a bottom electrode on the polysilicon;

forming a self-aligned gate stack, including:

depositing a layer of silicon nitride to a thickness of between about 200 nm to 400 nm thick;

patterning and selectively etching the silicon nitride, the bottom electrode and the polysilicon, wherein the patterned and etched bottom electrode defines a bottom electrode area;

selectively etching the polysilicon to the level of the first dielectric layer; and implanting and activating ions to form a source region and a drain region, wherein the source region and drain region are aligned with the bottom electrode area and wherein neither the source region nor the drain region underlie the bottom electrode area;

depositing a layer of silicon oxide, wherein the silicon oxide layer is between about 1.5 times to 2.0 times the thickness of the gate stack;

planarizing the silicon oxide layer to the level of the silicon nitride;

removing the silicon nitride; forming a sidewall barrier layer by depositing a layer of barrier metal in a thickness of between about 5 nm to 30 nm;

depositing a layer of ferroelectric material on the bottom electrode covering the bottom electrode area and aligned therewith;

forming a top electrode structure on the ferroelectric material including depositing top electrode metal on the ferroelectric stack, including depositing a material taken from the group of materials consisting of Ir, Pt, and Ir—Pt alloy, wherein the top electrode structure coven the bottom electrode area and is aligned therewith; and finishing the structure, including passivation, oxide depositing and metallization.

13. The method of claim 12 wherein said polysilicon layer is formed to a thickness of between about 50 nm to 300 nm.

14. The method of claim 12 wherein said depositing a bottom electrode includes depositing an electrode material taken from the group of materials consisting of Ir, Pt, TiN, Ta, TaN, TiTaN and Ir—Pt alloy, wherein the deposited materials are taken from the group of materials consisting of TiN, TaN, and TiTaN, depositing a layer of material taken from the group of materials consisting of Ir and Pt over the bottom electrode.

15. The method of claim 12 wherein said forming a sidewall barrier layer includes depositing a material taken from the group of materials consisting of $TiO_2$, $Al_3O_5$, and $Si_3N_4$.

16. The meted of claim 12 wherein said depositing a layer of ferroelectric material includes depositing a material taken from the group of materials consisting of PGO, PZT or SBT.

17. The method of claim 12 wherein said depositing a top electrode includes depositing electrode material to extend beyond the margins of the active device area.

18. A method of making a self-aligned ferroelectric memory transistor, comprising:

preparing a substrate, including forming a p-well, depositing a first dielectric layer over the p-well, and forming a layer of n+ polysilicon over the first dielectric layer;

forming shallow trenches for use in a shallow trench isolation process, wherein the shallow trenches extend through the polysilicon, the first dielectric layer, and about 500 nm of the substrate;

depositing silicon oxide in the shallow trenches;

removing the polysilicon except in active areas;

depositing a bottom electrode on the polysilicon;

forming a gate stack, including:

depositing a layer of silicon nitride to a thickness of between about 200 nm to 400 nm;

patterning and selectively etching the silicon nitride, the bottom electrode and the polysilicon, wherein the patterned and etched bottom electrode has an outer margin;

selectively etching the polysilicon to the level of the first dielectric layer; and implanting and activating ions to form a source region and a drain region, wherein the source region and the drain region each have an edge aligned with the bottom electrode outer margin and wherein the source region and drain region do not underlie any portion of the bottom electrode;

depositing a layer of silicon oxide, wherein the silicon oxide layer is between about 1.5 times to 2.0 times the thickness of the gate stack;

planarizing the silicon oxide layer to the level of the silicon nitride;

removing the silicon nitride;

forming a sidewall barrier layer by depositing a layer of barrier metal in a thickness of between about 5 nm to 30 nm;

depositing a layer of ferroelectric material on the bottom electrode, the ferroelectric material having margins coincident with the bottom electrode outer margin;

forming a top electrode structure on the ferroelectric material including:
  depositing a layer of silicon nitride to a thickness of between about 100 nm to 300 nm on the ferroelectric stack;
  etching the silicon nitride layer to form a control gate placeholder;
  depositing a layer of oxide over the structure and planarizing the oxide to the top of the silicon nitride layer;
  removing the silicon nitride; and depositing top electrode metal on the ferroelectric stack, wherein the top electrode overlays the ferroelectric material and the bottom electrode, and wherein the margins of the top electrode are coincident with the bottom electrode outer margin; and finishing the structure, including passivation, oxide depositing and metallization.

19. The method of claim 18 wherein said polysilicon layer is formed to a thickness of between about 50 nm to 300 nm.

20. The method of claim 18 wherein said depositing a bottom electrode includes depositing an electrode material taken from the group of materials consisting of It, Pt, TiN, Ta, TaN, TITaN and Ir—Pt alloy, wherein the deposited materials are taken from the group of materials consisting of TiN, TaN, and TiTaN, depositing a layer of material taken from the group of materials consisting of Ir and Pt over the bottom electrode.

21. The method of claim 18 wherein said forming a sidewall barrier layer includes depositing a material taken from the group of materials consisting of $TiO_2$, $Al_3O_5$, and $Si_3N_4$.

22. The method of claim 18 wherein said depositing a layer of ferroelectric material includes depositing aniaterial taken from the group of materials consisting of PGO, PZT or SBT.

23. The method of claim 18 wherein said depositing a top electrode includes depositing an electrode material taken from the group of materials consisting of Ir, Pt, and Ir—Pt alloy.

24. The method of claim 18 wherein said depositing a top electrode includes depositing electrode material to extend beyond the margins of the active device area.

* * * * *